April 6, 1965 TOSHIO KUROSAWA ETAL 3,177,414

DEVICE COMPRISING A PLURALITY OF TRANSISTORS

Filed July 3, 1962

2 Sheets-Sheet 1

INVENTORS
TOSHIO KUROSAWA
ICHIEMON SASAKI
BY HIROSHI SHIBA

ATTORNEY

INVENTORS
TOSHIO KUROSAWA
ICHIEMON SASAKI
BY HIROSHI SHIBA

ATTORNEY

United States Patent Office 3,177,414

Patented Apr. 6, 1965

3,177,414

DEVICE COMPRISING A PLURALITY OF TRANSISTORS

Toshio Kurosawa, Ichiemon Sasaki, and Hiroshi Shiba, Tokyo, Japan, assignors to Nippon Electric Company, Limited, Tokyo, Japan, a corporation of Japan Filed July 3, 1962, Ser. No. 207,274

Claims priority, application Japan, July 26, 1961, 36/26,871, 36/26,872

4 Claims. (Cl. 317—235)

This invention relates to electrical circuit components of the semiconductor type.

Heretofore, it has been common practice in the manufacture of electronic equipment to make the various components such as for example transistors, separately and then to assemble them by means of soldered connections in accordance with a circuit diagram. This conventional technique has a number of disadvantages among which are that the soldered connections contribute to unreliability and require the use of space, which imposes a limitation on the minimum size which can be achieved for a given equipment design. This size limitation is an extremely important consideration in the design of miniature equipment.

Additionally, when transistors are employed in cascade, the transistor in the later stage generally must handle greater power than the transistor in the earlier stage. Therefore, if both transistors are equal in size, the optimum size for the power handled is not achieved and this too is somewhat of a limiting factor on the minimum size that can be produced.

Accordingly, it is an object of this invention to provide a component in the form of a single or unitary body of material which replaces a number of equivalent components of the prior art and which occupies considerably less space.

It is a further object of the invention to improve the reliability of electronic equipment utilizing semiconductor devices by providing a plurality of operative semiconductor units in a single structure to thereby eliminate the necessity for solder connections between certain portions of the units.

It is a still further object to provide a compound transistor structure comprising a pair of transistors in which one of the transistors is adapted to receive the output from the other transistor, said one transistor being capable of handling greater power than said other transistor.

These and other objects, features and advantages of the invention will be best understood from the following description, taken in conjunction with the claims and the drawings in which:

Figure 4:
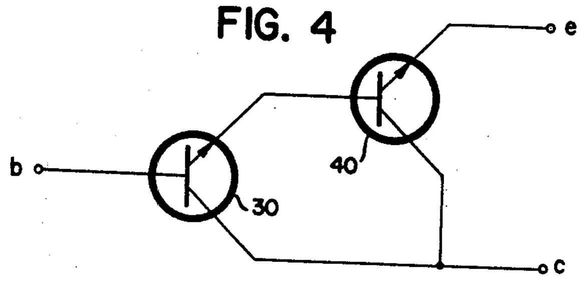
FIGURE 4 shows a further example of a known circuit with which a device made in accordance with the invention may be employed.
Figure 6:
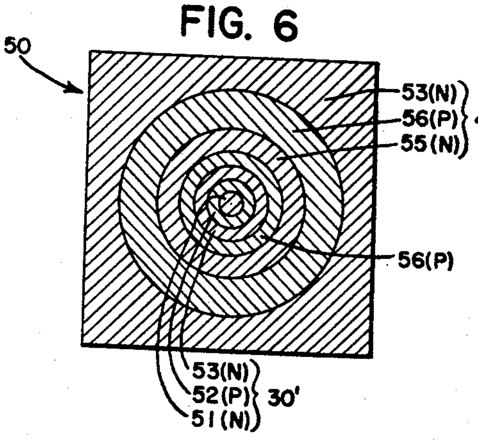
Figure 7:
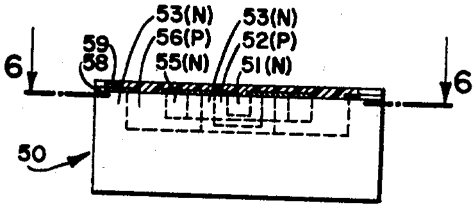
Figure 5A:
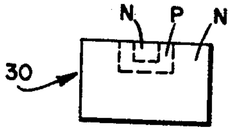
Figure 5B:
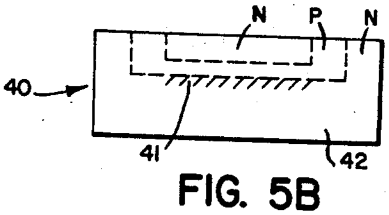

FIGURES *5a* and *5b* are enlarged sectional views of typical semiconductor devices which might be used with the circuit of FIGURE 4;

FIGURE 6 is an enlarged plan view taken along the line 6—6 of FIGURE 7, of a device made in accordance with the invention suitable for use with the circuit of FIGURE 4, which replaces the devices of FIGURES *5a* and *5b*, and FIGURE 7 is a sectional view in elevation of the device of FIGURE 6.

Figure 1:
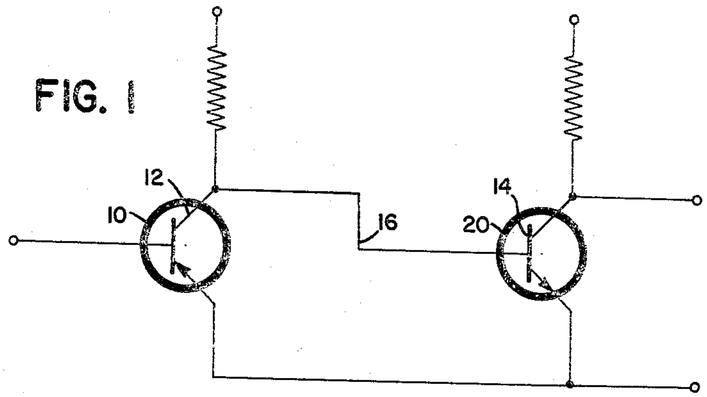
FIGURE 1 shows an example of a known circuit with which a device made in accordance with the invention may be employed.

Referring now to FIGURE 1, a first stage transistor 10 having a collector 12 is coupled to the base 14 of a following stage transistor 20. In accordance with the invention, the collector of the transistor 10 and the base of the transistor 20, which are connected together by a wire 16 in FIGURE 1, comprise a common region in a single structure, this structure serving as two transistors 10 and 20 of FIGURE 1.

Figure 2:
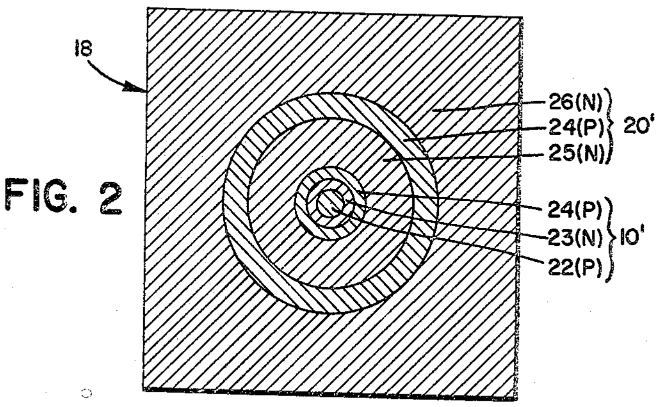
FIGURE 2 is an enlarged plan view of a device made in accordance with the invention and taken along the line 2—2 of FIGURE 3.
Figure 3:
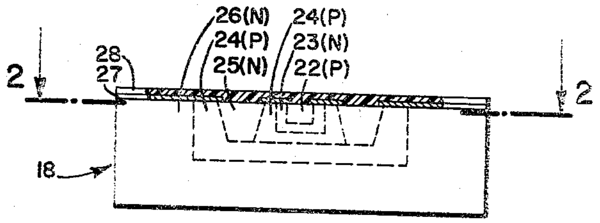
FIGURE 3 is a sectional view in elevation of the device of FIGURE 2.

Referring now to FIGURES 2 and 3, there is shown a semiconductor body 18, the numerals 22, 23 and 24 representing respectively the emitter, base and collector regions or elements of a transistor 10′ which can be considered the equivalent of the transistor 10 of FIGURE 1. The region 24 serves not only as the collector of the transistor 10′ but also serves as the base of the next stage transistor 20′, which is the equivalent of the transistor 20 of FIGURE 1. The regions 25 and 26 comprise the emitter and collector respectively of the transistor 20′.

As can be seen from FIGURES 2 and 3, the first stage transistor 10′ is made generally within the second stage transistor 20′. By this construction the second stage transistor 20′ may be made larger than the first stage 10′ to thereby more effectively handle the increased power commonly encountered in the subsequent stage.

It will be noted that the first stage 10′ is shown as a PNP and the second stage 20′ as an NPN type transistor, however, these can of course be interchanged in which case the common region or element 24 which serves as both a collector and a base would be a region of the N type rather than the P type as above. The emitter elements 22 and 25 of the transistors 10′ and 20′ have a common connection in the diagram of FIGURE 1. This can be accomplished in various ways, one technique being to form an insulating film 27 on the top surface of the body 18, removing portions of the film to expose the material comprising the emitters and then depositing a suitable metallic film 28 on the coating.

Referring now to FIGURE 4 there is shown a wiring diagram well known to those knowledgeable in the art as a Darlington Circuit and includes two transistors 30 and 40. In this circuit, imput signals are applied between the terminals *e* and *b*, are amplified by the transistor 30, and the output is applied to the transistor 40. The output from the circuit appears between the terminals *e* and *c*. As the connection between the transistors 30 and 40 is direct, the current is amplified by a multiple factor, and the amplification factor is of the order of 500–1,000. Consequently, the transistor 40 must be capable of handling much greater power than the transistor 30 and the PN junction area of the transistor 40 therefore must be relatively large.

Now consider the employment of individual transistors such as those shown in FIGURES *5a* and *5b* corresponding to transistors 30 and 40, respectively, in FIGURE 4. In the latter transistor, as shown in FIGURE *5b*, only the region 41, indicated by hatched lines of the collector junction area contributes to transistor operation, owing to the voltage drop in the lateral direction of the base region. Further the region 42 does not operate as a collector but instead produces a detrimental effect due to increase in collector capacitance. This detrimental effect is eliminated by means of the construction shown in FIGURES 6 and 7.

In FIGURES 6 and 7 there is shown a compound semiconductor body 50 which comprises two transistors 30′ and 40′, serving as the transistors 30 and 40 of FIGURE 4. The transistor 30′ comprises the regions 51, 52 and 53, these regions serving as the emitter, base and collector elements, respectively. The transistor 40′ comprises the regions 55, 56 and 53, these regions serving as the emitter, base and collector elements, respectively, of this transistor.

The emitter 51 of the transistor 30' can be connected to the base 56 of the transistor 40' by means of an insulating coating 58 and metal coating 59 in the same manner as taught with respect to the compound structure 18 of FIGURES 2 and 3.

The transistors 30' and 40' are shown as NPN types however, it will be appreciated that PNP types may be formed in a similar manner. Further, the circular shapes of the individual regions comprising the compound transistor structure 50 of FIGURES 6 and 7 and also the structure 18 of FIGURES 2 and 3 are only exemplary and various other configurations, such as arc and U-shapes can also be satisfactorily employed. If desired, the device of FIGURES 6 and 7 can be made into a light sensitive-amplifier by substituting a light sensitive element for the transistor 30' in the central region of the compound structure 50.

While the foregoing description sets forth the principles of the invention in connection with specific apparatus, it is to be understood that the description is made only by way of example and not as a limitation of the scope of the invention as set forth in the objects thereof and in the accompanying claims.

We claim:

1. A compound semiconductor device comprising
a single body of semiconductor material,
said body including a first and a second transistor each having emitter, base and collector regions of generally annular shape, said regions being substantially concentric and terminating at a surface of said body, only one of said regions being common to each of said transistors,
and the emitter, base and collector regions of said second transistor being respectively larger than the emitter, base and collector regions of said first transistor to render said second transistor capable of handling greater power than said first transistor.

2. The invention as recited in claim 1 wherein said common region serves as the collector of said first transistor and the base of said second transistor.

3. The invention as recited in claim 1 wherein said common region contains a collector element for each of said transistors, said latter mentioned collector elements comprising portions contiguous to one another.

4. The invention as recited in claim 1 wherein the external portion of said body forms the collector of said second transistor.

References Cited by the Examiner

UNITED STATES PATENTS

| | | | |
|---|---|---|---|
| 2,663,806 | 12/53 | Darlington | 317—234 X |
| 2,874,232 | 2/59 | Jochems | 317—235 X |
| 2,981,877 | 4/61 | Noyce | 317—235 |
| 2,985,804 | 5/61 | Buie | 317—235 |
| 3,025,589 | 3/62 | Hoerni | 317—235 |
| 3,038,087 | 6/62 | Luscher | 317—235 |
| 3,046,405 | 7/62 | Emeis | 317—235 X |
| 3,103,599 | 9/63 | Henkels | 317—235 |

DAVID J. GALVIN, *Primary Examiner.*

ARTHUR GAUSS, *Examiner.*